United States Patent [19]
Clarke et al.

[11] Patent Number: 5,334,931
[45] Date of Patent: Aug. 2, 1994

[54] MOLDED TEST PROBE ASSEMBLY

[75] Inventors: Norman B. Clarke, Pleasant Valley; Lawrence G. Cook; Robert G. Doyle, both of Poughkeepsie; Michael Renner, Highland, all of N.Y.

[73] Assignee: International Business Machines Corporation, Armonk, N.Y.

[21] Appl. No.: 790,334

[22] Filed: Nov. 12, 1991

[51] Int. Cl.⁵ .................................................. G01R 1/02
[52] U.S. Cl. ..................................... 324/757; 324/762
[58] Field of Search ............... 439/482, 483; 324/72.5, 324/149, 158 P, 158 F; 264/129

[56] References Cited

U.S. PATENT DOCUMENTS

| | | | |
|---|---|---|---|
| 3,221,089 | 11/1965 | Cotton | 264/261 |
| 3,810,016 | 5/1974 | Chayka | 324/72.5 |
| 4,045,737 | 8/1977 | Coberly | 324/158 P |
| 4,574,235 | 3/1986 | Kelly et al. | 324/158 F |
| 4,639,058 | 1/1987 | Morgan | 324/158 F |
| 4,701,703 | 10/1987 | Malloy | 324/158 F |
| 4,757,256 | 7/1988 | Whann et al. | 324/158 P |
| 4,880,395 | 11/1989 | Eriksson et al. | 439/483 |
| 4,897,602 | 1/1990 | Lin | 324/158 F |
| 4,951,370 | 8/1990 | Reid | 324/158 P |
| 4,998,062 | 3/1991 | Ikeda | 324/158 P |
| 5,006,792 | 4/1991 | Malhi et al. | 324/72.5 |
| 5,059,898 | 10/1991 | Barsotti | 324/158 P |
| 5,075,621 | 12/1991 | Hoyt | 324/158 P |
| 5,172,050 | 12/1992 | Swapp | 324/158 P |
| 5,214,375 | 5/1993 | Ikeuchi et al. | 324/158 F |

*Primary Examiner*—Vinh Nguyen
*Attorney, Agent, or Firm*—Whitham & Marhoefer

[57] ABSTRACT

A probe 100 which can be formed from a molded plastic provides an inexpensive construction for a probe which may be readily replaced in electrical testing apparatus, particularly of the automated type. A conductive contact tip 18 is preferably co-molded into a cantilevered portion 14' of a body block 14 and a conductive material 16 is provided over a portion of the surface of the body block 14 extending from the contact tip 18 to an attachment portion 15 of the body block. Cooperating attachment structures 22, 24 are provided on both the body block 14 and a holder block 20 to provide a snap fit therebetween. The holder block 20 can be provided with a resilient tab 29 opposing the attachment portion of the body block for engagement with a connector lug 12 of the testing apparatus, sandwiching the connector lug 12 between the attachment portion 15 of the body block 14 and the holder block 20. Flanges of the holder block 20 provide lateral support for the cantilevered portion 14' of the body block. Contact tip 18 is located on cantilevered portion 14' with high precision through the use of a preload block 140 which is separated from the body block 14 or probe tip sub-assembly 210 after molding.

15 Claims, 3 Drawing Sheets

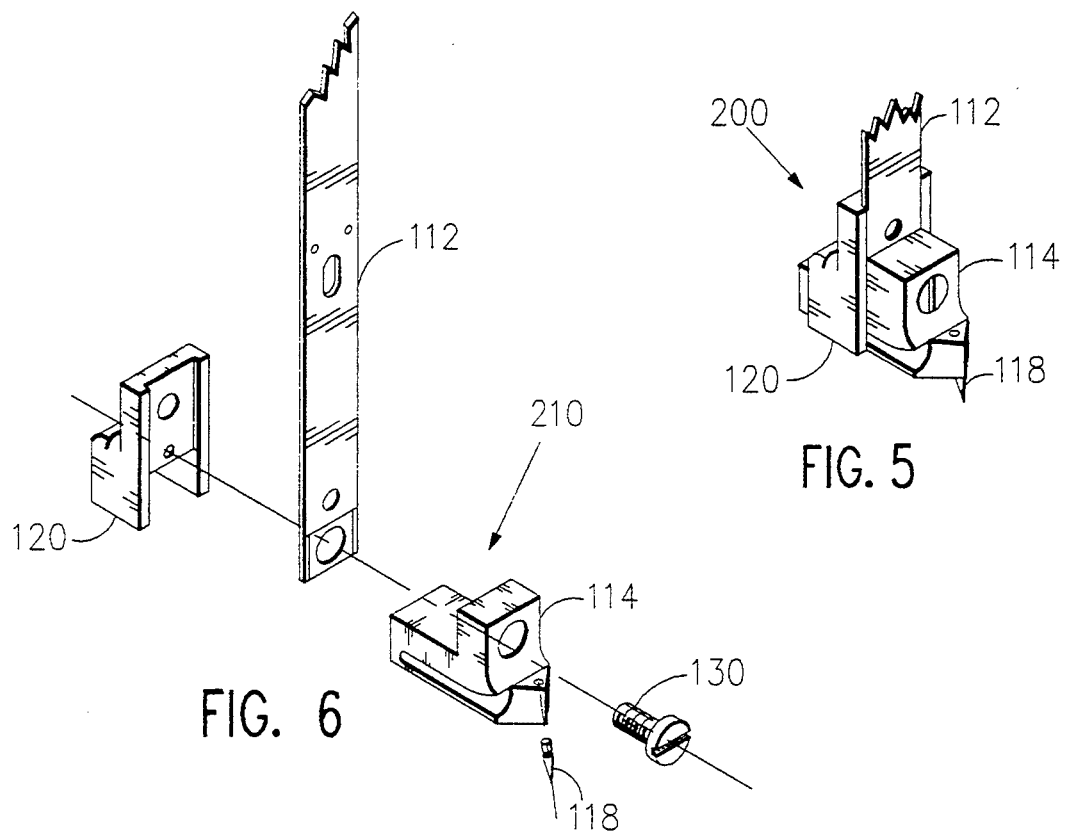
FIG. 5
FIG. 6
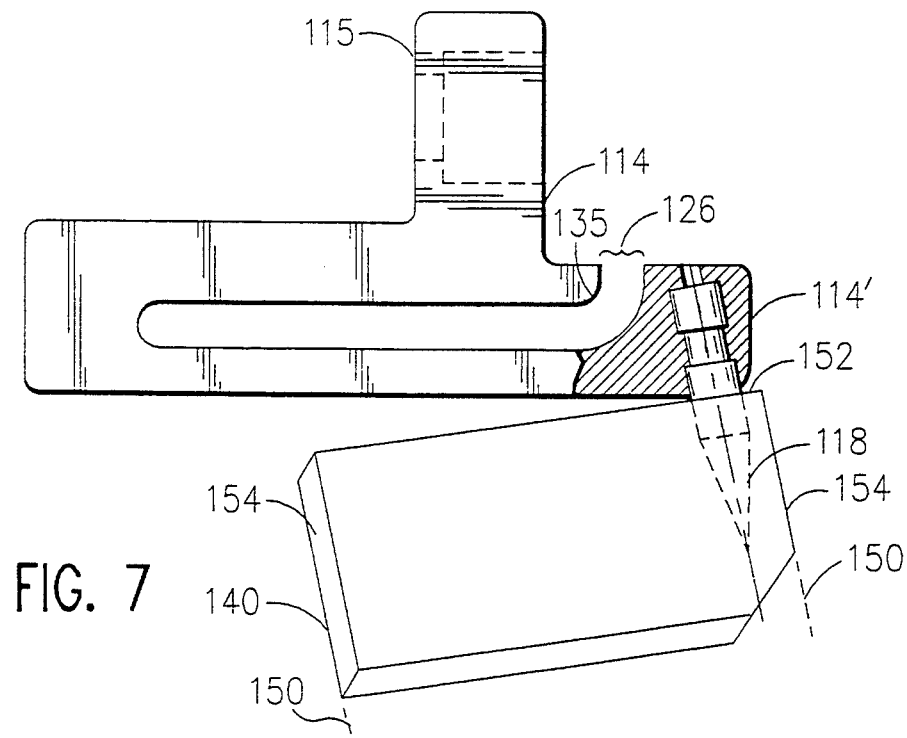
FIG. 7

MOLDED TEST PROBE ASSEMBLY

BACKGROUND OF THE INVENTION

1. Field of the Invention

The present invention generally relates to probes for use in the testing of electronic components and, more particularly, to the structure and process for the fabrication of probes particularly adapted for automated testing of electronic equipment and components.

2. Description of the Prior Art

The testing of electrical equipment and components typically requires the establishment of temporary circuits by which electrical voltages and currents in the circuit or component can be sensed or inferred from voltages appearing at particular points of the circuit or component. In the manufacture of components or complete circuits of substantial complexity, such test steps have become a normal part of the manufacturing process. In circumstances where large numbers of such circuits or components are manufactured, it is common to automate the testing process which is carried out at one or more points during the manufacturing process.

The formation of the temporary circuit is typically done by means of one or more probes which allow electrical contact with the circuit or component to be made in a small, well-defined area. The use of a probe can often avoid the possibility of engendering spurious connection of different parts of the circuit or component which could damage the same when operational levels of voltage and current are applied thereto, as is often necessary for effective functional testing to take place. This function of a probe is often enhanced by the provision of a relatively sharply pointed contact tip; the sharpness of the point being such as to inherently avoid bridging of conductors of the electrical circuit or component. The sharpness of the point can also be useful in penetrating or dislodging contamination and oxidation to increase the reliability of the electrical contact.

Automation of the testing process usually involves the bringing of a plurality of probes into contact with the electrical circuit or component by mechanical means. This often poses difficulties, particularly when plural probes are simultaneously applied to the circuit or component. Dimensional variations from unit to unit and within each unit under test (UUT) may cause problems by some probes failing to contact the UUT concurrently with contact by other probes. Increasing proximity of the UUT and the mechanism carrying the probes can cause breakage of some of the probes. Broken probes can cause ambiguity of testing, especially when so-called go/no-go tests are performed, and expensive down-time of the automated test apparatus while the probe is replaced.

In the formation of electrical connections without the bonding of conductors, it is common to provide resiliency of at least a portion of one or more of the contacting parts. U.S. Pat. Nos. 4,969,842 to Davis and 4,921,430 to Matsuoka are exemplary of such arrangements. Matsuoka provides a cantilever structure to provide resiliency of the conductors within a socket for an integrated circuit. Matsuoka also provides insulation on the resilient conductors to electrically separate the same in an IC socket. Multiple contact test probes having insulation between probe conductors are shown, for example, by U.S. Pat. No. 3,992,073 to Buchoff et al. The inclusion of other structures in the probe tip to improve response of the probe, for example to high frequencies, is taught by U.S. Pat. No. 4,116,523 to Coberly et al. The plating of materials to form conductors on an insulator for a coaxial connector is taught, for example, in U.S. Pat. No. 3,363,221 to Stark. The plating of conductors to improve electrical contact properties and the provision of additional metal to facilitate welding in the formation of an electrical connector is taught in U.S. Pat. No. 4,290,665 to Krasnov et al.

The increasing miniaturization of electronic circuits and components has also increased the precision required for the probes in automated testing machinery. To obtain sufficient accuracy in the dimensions of probes, it has been common to shape the probes or parts thereof by machining which is a costly and time-consuming process, resulting in a high cost for probes of presently used designs. The decreased size also has tended to increase breakage of the probes under conditions such as those described above. It is also possible that stresses placed on the small parts during the machining process tends to cause fatigue of the materials, also contributing to breakage and expenses of operating automated testing machinery.

SUMMARY OF THE INVENTION

It is therefore an object of the present invention to provide a probe structure which can be fabricated by an inexpensive process having high dimensional precision.

It is another object of the invention to provide an inexpensive, yet precise process for fabricating probes of a design which is resistant to breakage, can be readily replaced in automated testing machinery and highly effective in providing reliable contacts to a UUT.

It is a further object of the invention to provide a design for a probe having the above properties and qualities as well as ease of assembly and small number of parts and which can be quickly installed or replaced in automated testing equipment.

In order to achieve the above and other objects of the invention, a probe tip sub-assembly is provided including a body block having a cantilevered portion and an attachment portion, a contact tip located on said cantilevered portion and a conductive material overlying at least a portion of said body block extending from said contact tip to said attachment portion.

In accordance with another aspect of the invention, a probe tip is provided having a body block including a cantilevered portion and an attachment portion, a contact tip located on said cantilevered portion, a conductive material overlying at least a portion of said body block from said contact tip to said attachment portion and a holder block shaped to cover at least said attachment portion of said body block, said body block and said holder block each including a portion of an attachment means for attaching said holder block and said body block together in a predetermined positional relationship.

In accordance with a further aspect of the invention, a method of making a probe tip sub-assembly is provided including molding a body block having a cantilevered portion including a contact tip and an attachment portion and applying a conductive material to at least a portion of a surface of said body block extending from said contact tip to said attachment portion.

BRIEF DESCRIPTION OF THE DRAWINGS

The foregoing and other objects, aspects and advantages will be better understood from the following detailed description of a preferred embodiment of the invention with reference to the drawings, in which:

FIG. 5 is an isometric view of a preferred form of the alternative embodiment of the invention illustrated in FIG. 4, FIG. 6 is an exploded isometric view of the probe of FIG. 5, and FIG. 7 is a side view of the body block of the embodiment of FIG. 5 including a preload block.

DETAILED DESCRIPTION OF A PREFERRED EMBODIMENT OF THE INVENTION

Figure 1:
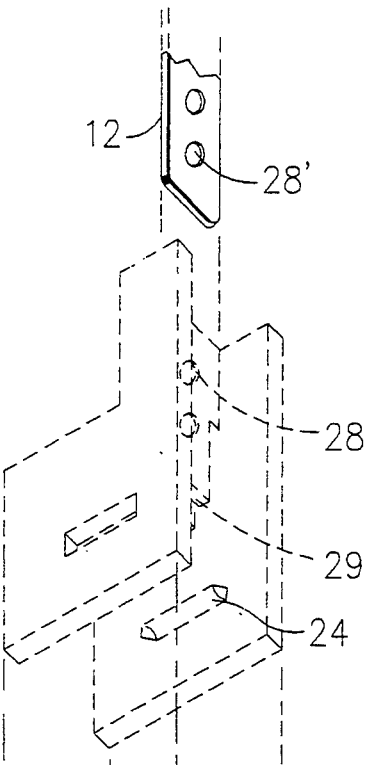
FIG. 1 is an enlarged overall view of an embodiment of a probe assembly according to the invention with the disassembly of some parts indicated with dashed lines.
Figure 1:
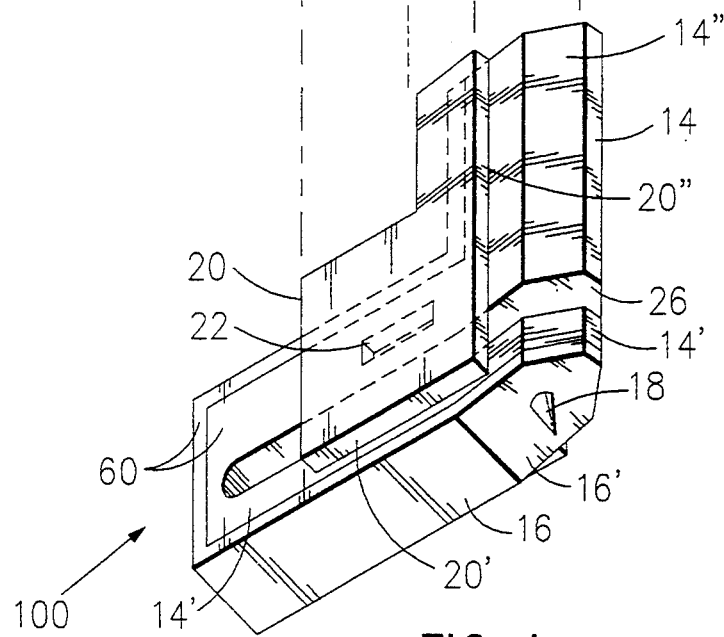

Referring now to the drawings, and more particularly to FIG. 1, there is shown an overall view of the probe assembly 100 according to the invention with removal of some parts shown in dashed lines to illustrate some details thereof. The probe assembly 100 according to the invention includes a probe body formed by a body block 14, a tip connector strip 16, a contact tip 18, preferably of tungsten carbide, and a holder block 20. The overall function of the probe assembly 100 is to provide a connection between the contact tip 18 which is to be brought into contact with the UUT and an attachment portion 15 (shown in FIG. 2) of the body block 14 in order to provide a structural and electrical connection to lug 12 which is provided on some structure by which the probe may be so positioned, such as a test jig (not shown) on an automated testing apparatus. It is to be understood, as will be discussed in greater detail below, that the probe assembly 100 may be assembled and simply plugged onto lug 12, in which case, protrusions 28 will interlock with holes or indentations 28' to retain the probe in place. Alternatively, holder block 20 may be attached to lug 12 and/or the test jig and the probe tip sub-assembly 60, including the body block 14, contact tip 18 and the tip connector strip 16, merely snapped into the holder block 20. In either case, lug 12 and connector strip 16 are sandwiched together between the attachment portion 15 of body block 14 and the holder block 20, establishing a good electrical contact therebetween. Additionally, a spring clamp 29 is preferably provided by separating the bottom of the U-shaped cross-section from the flanges 20" of the holder block 20 to form a resilient tab.

The body block 14 is preferably formed with a groove 26 which serves to separate a cantilevered portion 14' from the remainder of the body block 14 and to form a resilient arm to support contact tip 18. The tip connector strip 16 is preferably shaped generally in the form of a question mark to conform to the perimeter of the body block 14 and cantilever portion 14'. By doing so, and because the end of cantilevered portion 14' is preferably bevelled somewhat in the vicinity of contact tip 18, the resiliency of the conductor strip, which is preferably of copper, nickel or bronze, will cause it to be firmly retained on the body block 14 since the portion 16' of conductor strip 16 will resist movement of conductor strip 16 away from the periphery of body block 14. This retention of the conductor strip 16 on body block 14 may be enhanced, when the contact tip 18 is attached to conductor strip 16, by allowing the back of the contact tip 18 to protrude from the conductor strip, as shown at 44 of FIG. 2. In this case, if a hole is provided in a suitable location on the end of cantilevered portion 14', the cantilevered portion 14' can directly provide mechanical support for contact tip 18. At the same time, the fit of the back of contact tip 18 and the hole will provide an interlock against lateral shifting between the body block 14 and the conductor strip 16, particularly when contact tip 18 and conductor strip 16 have been affixed together such as by welding, soldering or the like. Alternatively, the contact tip 18 can be affixed to the cantilevered portion 14' of body block 14 by a friction fit, adhesive and/or co-molding either before or after assembly of the conductor strip 16 with body block 14 to achieve the same interlocking effect even prior to forming an electrical connection between the contact tip 18 and the conductor strip 16. Thus, the attachment of the contact tip 18 to either the cantilevered portion 14' of body block 14 or conductor strip 16, together with the shape and resilience of conductor strip 16, allows these parts to be retained together as a probe tip sub-assembly 60.

Additional lateral support for the cantilevered portion 14' of the probe tip sub-assembly 60 is provided by holder block 20. For this reason, holder block 20 preferably has a generally L-shaped profile when viewed from the side and a generally U-shaped cross-section when viewed from the front or below (e.g. from either end of the "L"). Inside the U-shaped cross-section of holder block 20, protrusions 24 are provided to interlock with recesses 22 in the body block 14. It should be understood that protrusions could be provided on the body block 14 and recesses in the holder block 20 or a combination of such structures could be used as an attachment means to provide for attaching the holder block 20 and the body block 14 together in a predetermined positional relationship. For example, if variations of the invention were fabricated with special properties, such as particular cantilever resiliency where it was desired to make parts of the variation incompatible with other parts of other variations, particular combinations of protrusions and recesses 22, 24 could be used for coding the parts of each variation. In any case, it is desirable that protrusions and recesses be sized similarly to provide a relatively tight and rigid fit when the probe is assembled. The resiliency of the flanges 20' thus provides a snap assembly when protrusions and recesses 22, 24 are used allowing ease of replacement of probe tip sub-assembly 60. However, other structures for the attachment of body and holder blocks could be provided as will be discussed in greater detail below.

The flanges 20', 20" of the holder block 20, extending beyond the snap assembly 22, 24, provide lateral positioning of the body block 14 and the conductor strip 16 for as much of the conductor strip 16 as may be desired. The flanges 20' also preferably provide support against lateral deflection of the cantilevered portion 14' of body block 14. The holder block 20 also provides insulation between probes when they are mounted closely together.

Figure 2:
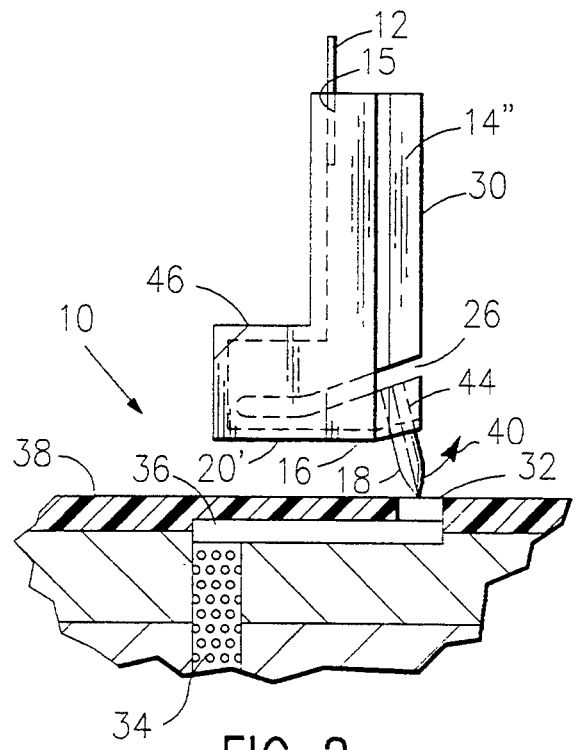
FIG. 2 is an illustration of an exemplary operating environment of the probe according to the invention in which the probe is shown in a side view.

The flanges 20', 20" of the holder block 20 may be extended as desired, although it is desirable to terminate the flange short of the perimeter of the probe tip sub-assembly 60, as shown at 46 of FIG. 2 to facilitate separation of the probe tip sub-assembly 60 from the holder block 20 for servicing the probe 100. As an example of extending the flanges beyond the point shown in FIG. 1 (which is nevertheless sufficient to provide lateral support for the cantilever portion 14'), it is deemed desirable to bring the ends of the flanges 20' flush with the undeflected position of conductor strip 16 where it overlies cantilever portion 14' as shown in FIG. 2. This serves as a visual guide for correct assembly of the probe as well as some protection against contacting an undesired portion of the UUT by conductor strip 16 since, as the probe 100 is brought into contact with the UUT, the surface of conductor strip 16 would be deflected below the ends of the flanges due to force exerted on contact tip 18.

Referring again to FIG. 2 which illustrates an exemplary use of the probe 100 according to the invention, other features of the invention will be described. In this illustration UUT 10 is a multi-layer ceramic structure which includes conductors 36, formed on the surface of selected layers and connections 34 between layers formed in through-holes or vias. An insulator layer 38 will often be provided on the outer surface with test points brought out at selected locations such as 32. These test points may be very closely spaced and it is desirable to provide an angular positioning of contact tip 18 so as to reach to the perimeter of the probe 100, as shown. This angular positioning, together with a bevelling of a portion of the body block 14, as shown at 14″ of FIG. 1, allows a number of probes to contact the UUT at very close spacing.

It should also be noted that the angular placement of the contact tip 18 in combination with cantilever portion 14' causes a slight positional shift of the contact tip 18 as it is brought into contact with the UUT. This action is desirable since the wiping action caused by this slight positional shift improves contact with the UUT by dislodging oxidation, surface contaminants and the like. However, this positional shift should be limited to less than half the dimension the design rules for the UUT specify for minimum spacing between test points 32. This can be easily done by limiting the width of groove 26. As the force increases and cantilever portion deflects, closing of the groove 26 will limit the lateral extent of the wiping motion within the bounds of test point 32 at forces below that which would damage the probe 100. For example, a nominal value of the contacting pressure has been established at less than 35 grams, a corresponding lateral deflection or wiping motion of the contact tip 18 is approximately 0.0015–0.002 inches. Since a sample probe according to this preferred embodiment of the invention has been subjected to a contacting force of 175 grams without damage, the geometry of the probe is believed to be maintained for contacting forces of that magnitude.

Figure 3:
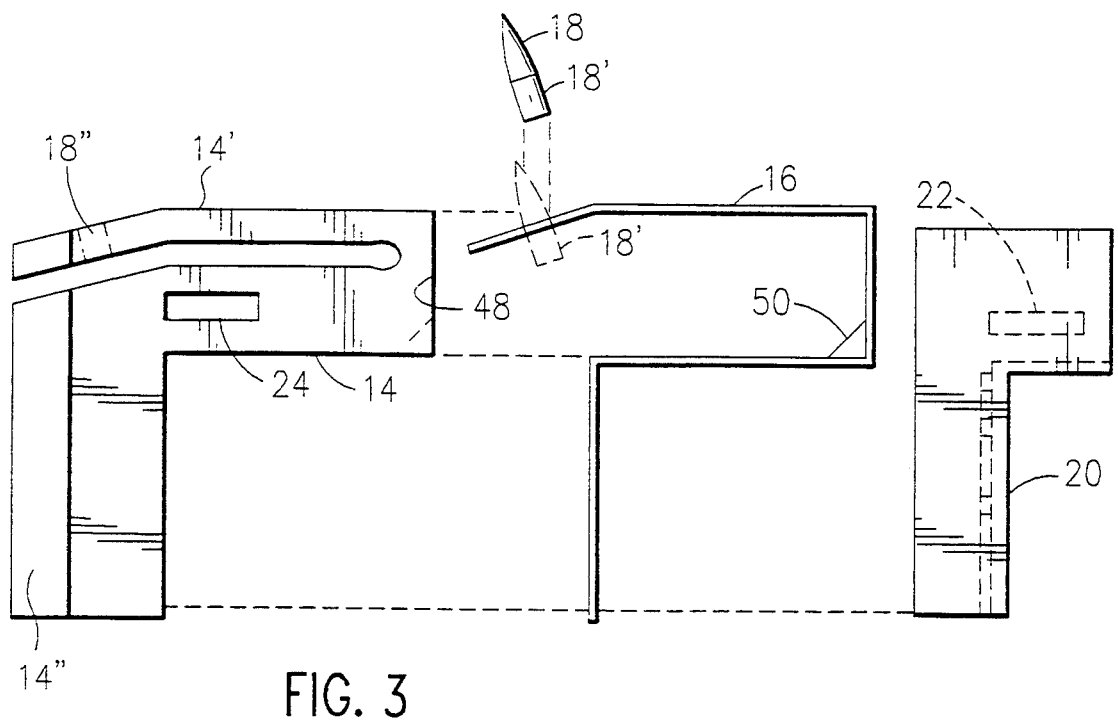
FIG. 3 is an exploded side view of the probe illustrated in FIG. 1.

Referring now to FIG. 3, a side view of each of the four basic parts of the probe 100 is shown in exploded form to more clearly indicate the positional relationship of features of each part during assembly. Contact tip 18 of tungsten carbide, copper or any platable metal is preferably attached to tip connector or conductor strip 16 by soldering or welding or any other technique providing electrical continuity. Alternatively, contact tip 18 can be molded in place at 18″ of body block 14 and conductor strip applied later in a secondary molding operation. Body block 14, in this embodiment is preferably injection molded from a non-catalyzed plastic which will not accept metal plating during later operations to prevent electrical contact between surfaces 14″ when probes 100 are positioned closely to one another. Injection molding minimizes shrinkage of the part after molding and reduces stresses in the molded part. In either case, the conductor strip 16 is mounted over the body block 14 with slight deflection so that it is thereafter held in place due to its own resilience. Further retention of this assembly is provided by the rear portion of contact tip 18 and hole 18″ as discussed above. If desired, a V-shaped formation 50 may be made in the conductor strip 16 and a cooperating depression 48 formed in the body block 14 to provide additional positioning. Whether or not cooperating shapes 48, 50 are used, the retention together of body block 14 and conductor strip 16 by the shape and resiliency of conductor strip 16 insures correct relative positioning of these parts during an additional co-molding step which adheres them together. This feature of the invention is particularly effective in facilitating automation of the process of manufacturing of the probe sub-assembly 60 according to the invention.

Specifically, after these three elements (body block 14, conductor strip 16 and contact tip 18) are assembled into a probe tip sub-assembly 60, the sub-assembly 60 is then preferably subjected to a further co-molding step which provides rigid mutual attachment of these parts by causing a slight melting and reshaping of body block 14 when heat and pressure are applied to the entire probe tip sub-assembly 60. This sub-assembly is then subjected to a gold plating which further enhances continuity between the contact tip 18 and conductor strip 16 as well as improving the conductivity of conductive strip 16. The sub-assembly 60 can then be attached to lug 12, as shown in FIGS. 1 and 2, by sandwiching the lug between the sub-assembly 60 and the holder block 20 by the snap fit provided by protrusions and recesses 22 and 24, as described above. The recesses are "walled" (e.g. protrusions and recesses are formed to be of the same lateral dimensions at the inner surface of flange 20' and the protrusions are tapered to provide self-aligning as the parts are joined) to provide repeatability and accuracy of assembly between the holder block 20 and body block 14. Molded-in spring 29 in the holder block 20 may be shaped during molding of the holder block 20 from a non-catalyzed plastic or later deformed in a manner to provide a preloading against lug 12.

It should be noted that holder block 20 may be affixed to the test jig at each location of a lug 12 and the probe tip sub-assembly 60 merely inserted into a holder block 20 or the probe tip sub-assembly 60 and the holder block 20 can be assembled together and clipped to lug 12. Either alternative provides adequate electrical connection, but the former alternative may yield improved positioning accuracy of the probe tip.

In view of the foregoing, it will be appreciated by those skilled in the art that the present invention provides a probe which requires no machining and can be produced by several inexpensive molding steps. The probe has high accuracy and can be easily and quickly replaced by simply clipping either the entire probe 100 or the probe tip sub-assembly 60 into place on a test jig.

An alternative embodiment of the present invention will now be described with reference to FIG. 4. Body block 14 is precisely the same shape as the combined shape of body block 14 and conductor strip 16 in the embodiment of FIGS. 1 and 3. However, in this case, the body block 14 is molded from a catalyzed plastic, preferably a material known as Vectra C-810, a liquid crystal polymer marketed by the Hoechst-Celanese Corp., or the equivalent, which can be plated. The probe tip sub-assembly 60 is formed by co-molding the contact tip 18 and the body block 14 in a single step, eliminating a second co-molding step. To improve structural integrity of the sub-assembly, contact tip 18 is preferably formed with a groove 44 which will be filled with plastic during the molding process. The plating, which is preferably applied by providing a 0.00025 nickel/gold flash, provides a conductor having a resistance of 0.90 ohms or less. This alternative reduces both the number of parts and the number of manufacturing steps and, therefore, is even more economical than the embodiment of FIGS. 1 and 3.

Figure 4:
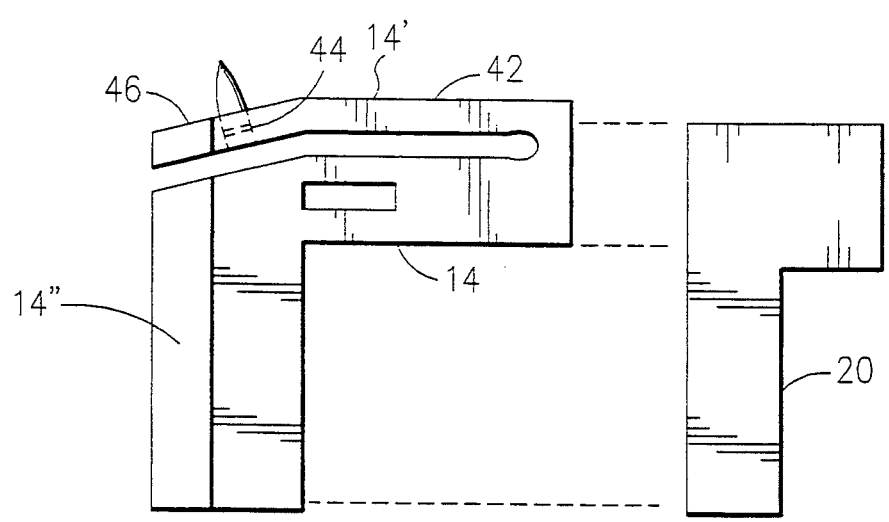
FIG. 4 is an exploded side view of an alternative embodiment of the invention.

In the embodiment of FIG. 4, the holder block 20 is not changed with respect to the embodiment of FIGS. 1 and 3 and all of the meritorious effects described with regard to that embodiment are present in the embodiment of FIG. 4. Also, since electrical continuity is provided by a plating, connection of contact tip 18, attachment of the probe to lug 12 is facilitated. The entirety of the surface of body block 14 may be plated or portions of the surface may be masked to avoid the possibility of contact between probes at surfaces 14″ as discussed above.

A preferred form 200 of the alternative embodiment is shown in isometric form in FIGS. 5 and 6 and in a side view, similar to that of FIGS. 3 and 4, in FIG. 7, which also includes a preferred technique of attaching the contact tip 118 to the body block 114. In this preferred form of the invention, a conductive body block 114 is produced by co-molding a probe or contact tip 118 directly into the body block 114 to form a single unit or probe tip sub-assembly 210, corresponding to probe tip sub-assembly 60 of FIGS. 1–4. The connection between the contact tip 118 and attachment portion 115 of the body block 114 is made by complete metallization of the co-molded probe tip sub-assembly 210. In this preferred form of the invention, the metallization is of copper, nickel and gold, preferably formed in five layers consisting of a copper strike of about 0.25 microinches, a full copper build of about 0.80 microinches, electroless nickel of about 0.50 micro inches, immersion gold of about 0.05 microinches and catalytic gold of about 0.20 microinches. This combination of layers produces high conductivity while retaining flexibility and resistance to metal fatigue and strain hardening. In this regard, it is considered important that the total thickness of these layers not exceed 2.0 microinches except in a fillet at contact tip 118 which will not be subject to substantial flexing. Some dissolution of the plastic during the process of forming these layers yields an integral bond between the plastic and the plating material which replaces the dissolved plastic and increases electrical conductivity of the probe tip sub-assembly 210.

Also, in this preferred form of the invention, attachment of the body block 114 and holder block 120 to power contact 112 is done by means of a screw 130 which passes through the body block 114 and engages internal threads within the holder block 120 which is preferably formed of ULTEM 1000 polyimide, available from General Electric Corporation, or an equivalent. This material is relatively less critical to the practice of the invention since the holder block 120 functions to provide positioning and insulation for the body block 114 and need not be plated. Alternatively, a nut (not shown) may be provided to cause the body block 114 and holder block 120 to sandwich the power connection lug 112. It has been found, in practice, that this preferred form of the invention is sufficiently reliable to diminish the relative value of the snap-fit engagement of the body block 14 and holder block 20 of the embodiment of FIGS. 1–4 compared to the reliability of the connection assured by the use of screw 130.

Referring now to FIG. 7, accurate placement of the contact tip 118 in body block 114 during the molding operation is achieved by the use of a preload block 140 which is also preferably formed of the Vectra C-810 liquid crystal polymer noted above. While it is considered preferable to use the same material for preload block 140 as is used in body block 114 to minimize the possibility of shifts due to thermal changes in dimensions during the injection molding process, other materials could also be used. For instance, metal preload blocks are known for use in injection molding processes. However, in addition to the advantage of dimensional stability engendered by the use of the same material as that of the body block 14, 114, it has been found that using an inexpensive plastic, which is more quickly and easily precision molded, is advantageous for production runs of more than about one hundred pieces. In view of the simplicity of the preload block 140, the contact tip 118 can be located and co-molded with the preload block with great accuracy over many such operations.

The preloaded sub-assembly of contact tip 118 and precision molded preload block 140 is then located in a precision pocket or cavity 154 cut into the surface of the mold used to form body block 114 and becomes a temporary cavity wall 152 of the mold.

For the molding of the probe tip sub-assembly 210, the mold is preferably formed in two pieces which separate generally in a plane parallel to the plane of the page of FIG. 7. The precision pocket for receiving preload block 140 follows lines 154. To prevent shifting of the preload block 140 under the pressures and temperatures of injection molding, a heel block, generally indicated at 150, is provided to apply opposing pressure to preload block 140. Using a mold including a precision pocket 154 and heel block 150, together with a preload block 140 of the same material as the body block 114 to hold contact tip 118 while forming a portion of the interior surface of the mold for body block 114, transfer of the contact tip 118 from the preload block 140 to the body block 114 is accomplished with the same accuracy with which the contact tip 118 was positioned in the preload block 140. In practice, this positioning accuracy is on the order of 30–50 millionths of an inch. The preload block 140 is separated from the body block 114 when the latter is ejected from the mold. Separation of the probe tip sub-assembly (e.g. body block 114 and contact tip 118) 210 and the preload block 140 can be facilitated by the application of a release material to surface 152 of the preload block. Any known release material is suitable for this purpose. However, if a release material is used, care must be exercised to avoid application of the release material to the portion of the contact tip 118 which extends into the portion of the mold used to shape the body block. The body block thus formed is then completed by metallization, as described above.

Additionally, it should be noted that the shape of the body block 114 differs slightly from that shown in FIGS. 1–4. Specifically, the path of the groove 126 is turned more sharply and, when contact is made to contact tip 118, support is provided by radiused shoulder 135. This configuration has been found to adequately limit the outward flexing of the contact tip 118 while limiting the amount of flexure at any point in the cantilevered arm in order to minimize metal fatigue of the metallization provided on the body block.

In view of the above, a probe tip assembly has been provided which requires a minimal number of parts which can each be formed with extremely high precision at much reduced cost since no machining steps are required. The probe tip assembly according to the invention can be easily installed or replaced in automated test equipment and has proven to be extremely durable and resistant to breakage during many cycles of use.

It is also to be understood that the method of achieving precision locating of a part while molding the body block 114 or probe tip sub-assembly 210 can be applied to many different articles of virtually any desired shape where such precision location of any part is desirable or necessary. The essential features of this method are the precision molding of a preload block with a portion of the part extending therefrom and the placement of the preload block in a pocket of a mold with the exposed portion of the part extending into the portion of the mold in which the article is to be shaped. The use of the same material for the preload block and the article and the use of a heel block 150 to oppose the forces exerted on the preload block 140 during molding are considered to be particularly useful in achieving high precision during injection molding processes.

While the invention has been described in terms of a single preferred embodiment, those skilled in the art will recognize that the invention can be practiced with modification within the spirit and scope of the appended claims.

Having thus described by invention, what I claim as new and desire to secure by Letters Patent is as follows:

1. A probe tip sub-assembly for contacting and testing an object, comprising:
    a body block having a cantilevered portion and an attachment portion and being formed with a groove such that said cantilevered portion is substantially separated from said attachment portion by said groove and such that said cantilevered portion has a predetermined resiliency, said body block comprising plastic,
    a contact tip located on said cantilevered portion and
    a conductive material overlying at least a portion of said body block from said contact tip to said attachment portion,
    said contact tip for traversing a surface of said object and wiping contaminants therefrom upon said contact tip being brought into contact with said object and until a limit of said predetermined resiliency of said cantilevered portion is reached.

2. A probe tip sub-assembly as recited in claim 1, wherein said body block is formed of a molded plastic.

3. A probe tip sub-assembly as recited in claim 1, wherein said body block is formed of an injection molded plastic.

4. A probe tip sub-assembly as recited in claim 3, wherein said conductive material is formed as a conductor strip.

5. A probe tip sub-assembly as recited in claim 4, wherein said conductor strip is shaped to conform to a portion of an outer surface of said body block.

6. A probe tip sub-assembly as recited in claim 4, wherein said conductor strip is affixed to said body block by co-molding.

7. A probe tip sub-assembly as recited in claim 5, wherein said conductor strip is affixed to said body block by co-molding.

8. A probe tip sub-assembly as recited in claim 3, wherein said injection molded plastic is platable and said conductive material is a plating on at least a portion of a surface of said body block extending from said contact tip to said attachment portion.

9. A probe tip sub-assembly as recited in claim 8, wherein said contact tip is co-molded with said body block.

10. A probe tip sub-assembly, comprising:
    a body block having a cantilevered portion and an attachment portion, said body block comprising plastic and being formed of an injection molded plastic,
    a contact tip located on said cantilevered portion and
    a conductive material overlying at least a portion of said body block from said contact tip to said attachment portion, said conductive material being formed and applied as a conductor strip,
    wherein said body block includes a hole formed therein, said contact tip being positioned in said hole and affixed to said conductor strip such that a portion of said contact tip protrudes from a surface of said conductor strip for engagement with said hole in said body block.

11. A probe tip sub-assembly as recited in claim 10, wherein said conductor strip is affixed to said body block by co-molding.

12. A probe tip for contacting and testing an object including:
    a body block including a cantilevered portion and an attachment portion and being formed with a groove such that said cantilevered portion is substantially separated from said attachment portion by said groove and such that said cantilevered portion has a predetermined resiliency, said body block comprising plastic,
    a contact tip located on said cantilevered portion,
    a conductive material overlying at least a portion of said body block from said contact tip to said attachment portion and
    a holder block shaped to cover at least said attachment portion of said body block,
    said body block and said holder block each including a portion of an attachment means for attaching said holder block and said body block together in a predetermined positional relationship,
    said contact tip for traversing a surface of said object and wiping contaminants therefrom upon said contact tip being brought into contact with said object and until a limit of said predetermined resiliency of said cantilevered portion is reached.

13. A probe tip as recited in claim 12, wherein said holder block is formed of a molded plastic and includes a resilient tab positioned to oppose said attachment portion of said body block when said body block and said holder block are assembled together.

14. A probe tip as recited in claim 13, wherein said resilient tab is shaped to provide preloading against said attachment portion of said body block when said body block is attached to said holder block.

15. A probe tip as recited in claim 13, wherein said molded plastic is platable and said conductive material is a plating on at least a portion of a surface of said body block extending from said contact tip to said attachment portion.

* * * * *